United States Patent [19]

Fukuoka

[11] 4,259,745
[45] Mar. 31, 1981

[54] TUNING INDICATOR CIRCUIT
[75] Inventor: Norio Fukuoka, Hachioji, Japan
[73] Assignee: Olympus Optical Co., Ltd., Tokyo, Japan
[21] Appl. No.: 944,004
[22] Filed: Sep. 20, 1978
[30] Foreign Application Priority Data
  Sep. 30, 1977 [JP] Japan .................................. 52/117555
[51] Int. Cl.³ .......................... H04B 1/16; H03J 1/02
[52] U.S. Cl. ........................................ 455/159; 334/36
[58] Field of Search .......................... 334/30, 36, 86; 325/398, 364, 455; 179/1 GN; 455/154, 159; 358/192.1, 192

[56] References Cited
U.S. PATENT DOCUMENTS

| Re. 19,170 | 5/1934 | Senauke | 325/455 |
|---|---|---|---|
| 3,365,669 | 1/1968 | Funaki et al. | 325/455 |
| 3,696,301 | 10/1972 | Hoshi | 325/398 |
| 3,882,399 | 5/1975 | Karpowyce et al. | 325/455 |
| 3,896,386 | 7/1975 | Ohsawa | 325/398 |
| 4,131,853 | 12/1978 | Dreiske | 325/455 |

Primary Examiner—Jin F. Ng

[57] ABSTRACT

Disclosed is a tuning indicator circuit including a receiver in which an output signal voltage of a detector circuit of the receiver is compared with a reference voltage from a voltage divider by means of a voltage comparator, whereby a tuned or untuned state of the receiver will be detected. The tuned or untuned signal is applied to a light emitting diode driver circuit via an AND circuit, together with a light emitting diode driving signal from an oscillator. The driving circuit allows a light emitting element for power supply and tuning indication to be continuously on in a tuned state, and turns the element on and off in a untuned state with power on.

5 Claims, 14 Drawing Figures

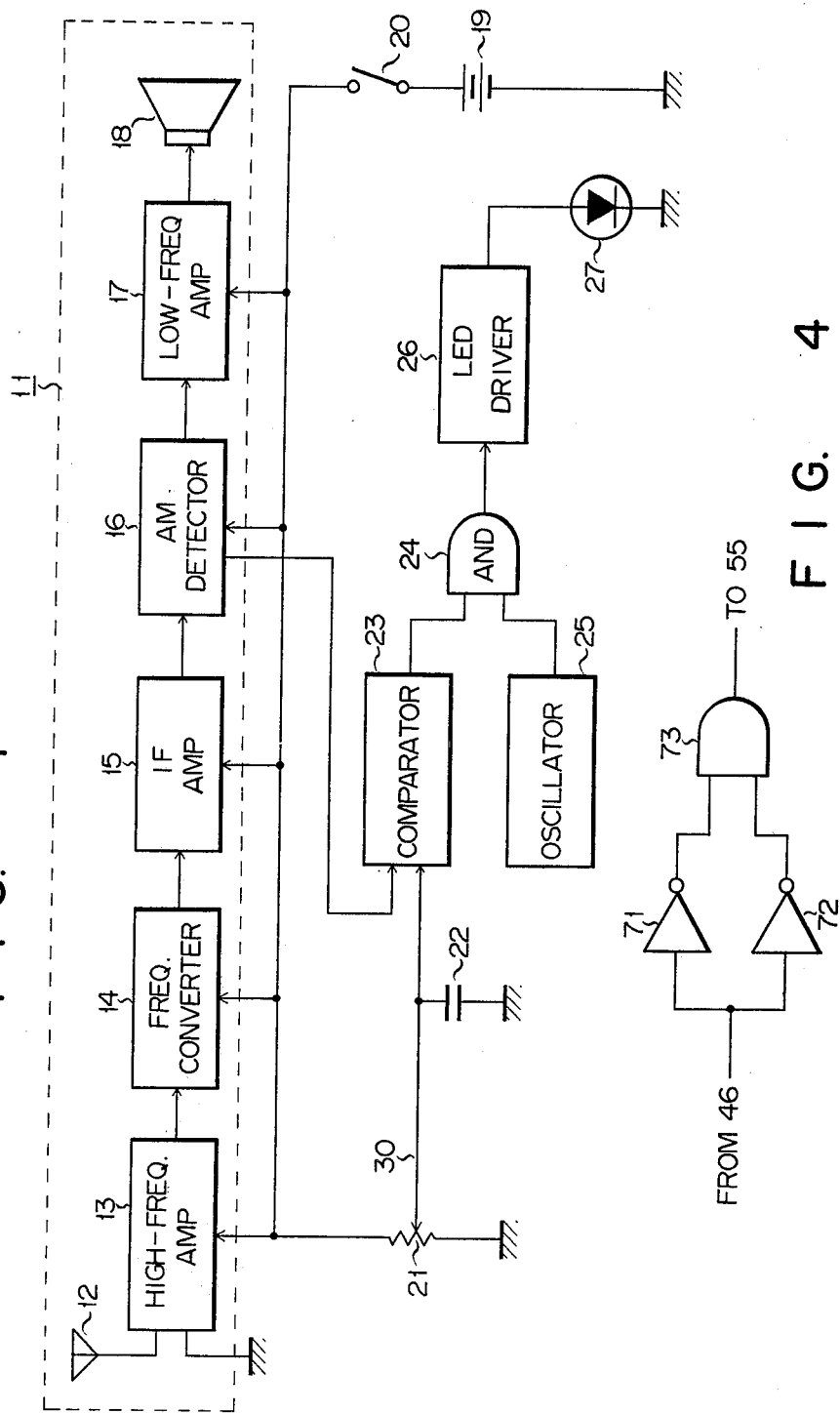

TUNING INDICATOR CIRCUIT

BACKGROUND OF THE INVENTION (I) Field of the Invention

This invention relates to a tuning indicator with a light emitting element for power supply indication also capable of tuning indication for a receiver.

(II) Description of the Prior Art

It is generally appreciated that the tuning indication for a radio receiver is of great significance.

In a subminiature radio receiver, however, it is difficult to provide separate light emitting elements for the power supply and tuning indications, because of limitations in shape and overall size.

On the other hand, it is clear that the indicating capability of each display element will be deteriorated if the element itself is reduced in size to achieve the separate indication.

Under these circumstances, there has been required a system to enable accurate indication of tuned and untuned states of the receiver.

SUMMARY OF THE INVENTION

The object of this invention is to provide a tuning indicator circuit capable of accurate indication of tuned and untuned states of a receiver, as well as of power supply indication, by means of a light emitting element originally for the power supply indication.

In order to attain the above object, the tuning indicator circuit of the invention comprises a receiver, a power source for supplying power to the receiver a means for comparing a detection output signal level of the receiver with a reference signal level, whereby a tuned or untuned state of the receiver will be detected, a means for indicating the power supply from the power source to the receiver and the tuned or untuned state, and a means for controlling the indicating means, so that the indicating means is rendered continuously on while the receiver is in the tuned state, and that the indicating means is turned on and off while the receiver is in the untuned state with power on.

BRIEF DESCRIPTION OF THE DRAWINGS

FIG. 1 is a block diagram showing an embodiment of this invention;

FIG. 2A shows a power signal waveform produced by turning a power switch on;

FIG. 2B shows an output signal waveform of an oscillator circuit with power on;

FIG. 4 is a circuit diagram showing an example of 0 V switch circuit;

DETAILED DESCRIPTION OF THE PREFERRED EMBODIMENT

Figure 3:
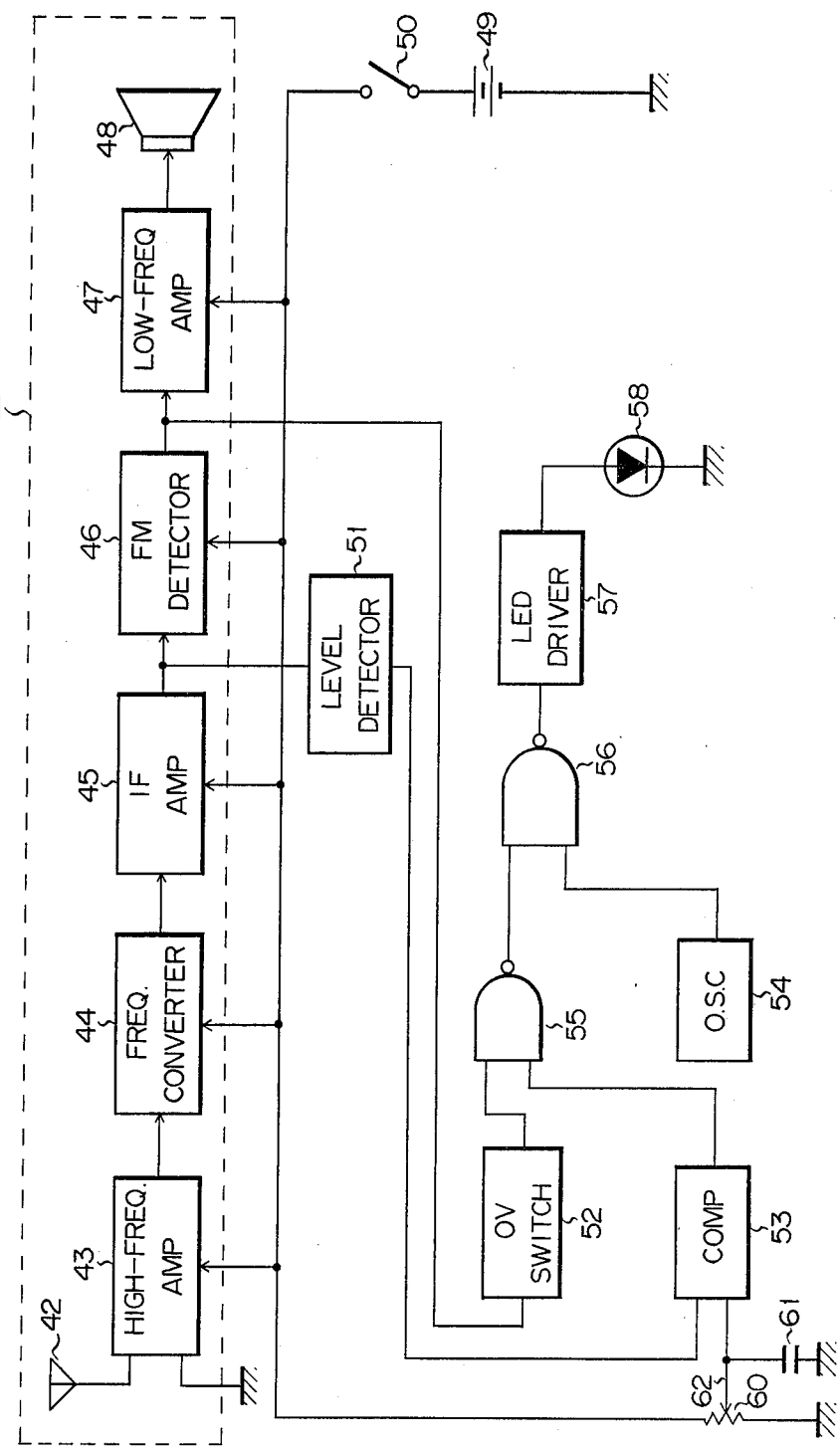
FIG. 3 is a block diagram showing another embodiment of the invention.

FIG. 1 shows an embodiment of this invention.

In a superheterodyne radio receiver 11, the output terminal of an antenna circuit 12 is connected to the input terminal of a high-frequency amplifier circuit 13. The output terminal of the high-frequency amplifier circuit 13 is connected to the input terminal of a frequency converter 14 including a local oscillator circuit (not shown), while the output terminal of the frequency converter 14 is connected to the input terminal of an IF amplifier circuit 15. Further, the output terminal of the IF amplifier circuit 15 is connected to the input terminal of an AM detector circuit 16. The output terminal of the detector circuit 16 is connected to the input terminal of a low-frequency amplifier 17, the output terminal of which is connected to the input terminal of a loudspeaker 18.

Since the operation of each individual circuit of the radio receiver 11 constructed as aforesaid is generally known, it is omitted from the description herein.

The power supply from a power source 19 of the receiver 11 may be applied and cut by means of a power switch 20. The power supplied to the receiver 11 is applied to a variable resistor 21. The variable resistor 21 functions as a reference level setter, having a sliding terminal 30 from which a divided voltage at a set reference voltage level is delivered. The sliding terminal 30 of the variable resistor 21 is connected to one end of a capacitor 22 and also to one input terminal of a comparator 23. The other end of the capacitor 22 is grounded.

The other input terminal of the comparator 23 is connected with the output terminal of the detector circuit 16 of the radio receiver 11. At the output of the comparator 23 appears a high-level signal when the detection output level of the detector circuit 16 is lower than the reference voltage level, that is, in the untuned state. On the other hand, a low-level signal is produced when the detection output level is higher than the reference voltage level, that is, in the tuned state. The output terminal of the comparator circuit 23 is connected to one input terminal of an AND circuit 24, the other input terminal of which is connected with the output terminal of an oscillator 25.

The AND circuit 24 is intended for controlling the output signal of the oscillator 25 by means of the output signal of the comparator 23. The oscillator 25 is formed of an astable multivibrator including e.g. a two-stage connected inverter circuit. The output of the oscillator 25 is a pulse signal of approximately 5 to 20 Hz, for example. The output terminal of the AND circuit 24 is connected to the input terminal of e.g. a light emitting diode driver circuit (hereinafter referred to as LED driver circuit) 26 as a display driver circuit. The output terminal of the LED driver circuit 26 is connected to one terminal of e.g. an LED 27 as a display element, the other terminal of which is grounded.

The LED driver circuit 26 is an analog switch circuit which is composed of PNP transistors, for example. This circuit 26 is so set as to conduct to let a driving current flow through the LED 27 when the input signal is at the low-level. When the input signal is at the high level, however, the driving current is cut off, and the LED 27 is prevented from being energized.

FIG. 2 shows output signal waveforms of the aforesaid circuits. FIG. 2A illustrates the power supply effected by turning on the power switch 20. FIG. 2B shows the waveform of the output signal of the oscillator 25 at time of such power supply, while FIG. 2C shows the output signal waveform of the comparator 23 indicating the untuned state during period t1–t2. Further, FIG. 2D shows the waveform of an input signal applied to the LED driver circuit 26, while FIG. 2E shows the output signal waveform of the driver circuit 26.

Turning now to FIG. 1, the LED 27 is supplied with no currnt and unlighted when the power switch 20 is off.

When the power switch 20 is on, however, electric power is supplied to both the radio receiver 11 and the variable resistor 21.

Consequently, a reference voltage divided by the variable resistor 21 is applied to one input terminal of the comparator circuit 23. On the other hand, the other input terminal of the comparator circuit 23 is supplied with the detection output signal of the detector circuit 16, and the voltage levels of both those signals are compared with each other.

When the receiver 11 is in the untuned state during period t1–t2, as shown in FIG. 2, the output signal of the comparator circuit 23 is at the high level. This high-level signal is applied to one input terminal of the AND circuit 24, whereas the output signal of the oscillator circuit 25 as shown in FIG. 2B is applied to the other input terminal of the AND circuit 24. As a result, the driver circuit 26 is supplied with an input signal with the waveform given within period t1–t2 of FIG. 2D. Consequently, an interrupted current as shown in FIG. 2E flows through the LED 27, which will go on and off. Thus, it may easily be noticed that the receiver 11 is being supplied with power while the LED 29 is going on and off.

Meanwhile, when the receiver 11 is in the tuned state during any other period than the period t1–t2, the detection output signal level of the detector circuit 16 becomes higher than the reference voltage level. In consequence, the output signal of the comparator circuit 23 is reduced to the low level, as shown in FIG. 2C.

Figure 2A:
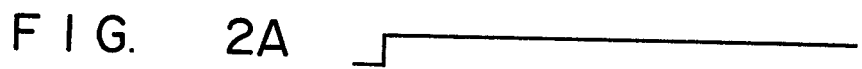
Figure 2B:
Figure 2C:
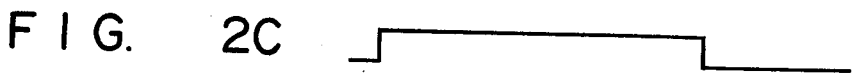
FIG. 2C shows an output signal waveform of a comparator.
Figure 2D:
FIG. 2D shows a waveform of an input signal applied to an LED driver circuit.
Figure 2E:
FIG. 2E shows an output signal waveform of the driver circuit.

Since this low level signal is applied to one input terminal of the AND circuit 24, and the other input terminal thereof is supplied with an oscillation frequency signal as shown in FIG. 2B from the oscillator 25, so the output signal of the AND circuit 24 becomes a low-level signal with the signal waveform as shown in FIG. 2D. Consequently, the output signal of the LED driver circuit 26 becomes a high-level signal as shown in FIG. 2E, which is supplied to the LED 29, so that the LED 29 is rendered continuously on.

Thus, the receiver 11 may be judged to be in the tuned state while the LED 27 is continuously on.

FIG. 3 shows another embodiment of this invention. An FM receiver 41 is composed of an antenna circuit 42, a high-frequency amplifier circuit 43, a frequency converter 44 including a local oscillator circuit, an IF amplifier circuit 45, an FM detector circuit 46, a low-frequency amplifier circuit 47, and a loudspeaker 48.

The power supply from a power source 49 of the receiver 41 may be applied and cut by means of a power switch 50.

Since the operation of each individual circuit of the FM receiver 41 constructed as aforesaid is generally known, as is the case with the embodiment of FIG. 1, it is omitted from the description herein.

The power supplied to the receiver 41 is applied to a variable resistor 60. The variable resistor 60 functions as a reference level setter, like the one used with the embodiment as shown in FIG. 1. A sliding terminal 62 of the variable resistor 60 is connected to one input terminal of a comparator 53 via a capacitor 61. The other input terminal of the comparator 53 is connected with the output terminal of the IF amplifier 45 via a level detector circuit 51.

The output terminal of the FM detector circuit 46 is connected to the input terminal of a switch circuit 52 through the level detector circuit 51. The zero volt switch circuit 52 included e.g. first and second voltage comparator circuits 71, 72 as shown in FIG. 4. The respective input terminals of the first and second comparator circuits 71 and 72 are connected to each other, while their output terminals are connected to first and second input terminals of an AND circuit 73, respectively. The respective reference voltages applied to the first and second comparator circuits 71 and 72 may be set at $+0.1$ V and $-0.1$ V, for example, and a high-level signal is to be delivered for an input voltage at $0\ V \pm 0.1$ V, while a low-level signal is to be produced for any other input voltage than such level. The output terminals of the zero volt switch circuit 52 and the comparator 53 are connected to first and second input terminals of a first NAND circuit 55, respectively. The output terminal of the first NAND circuit 55 is connected to one input terminal of a second NAND circuit 56, the other input terminal of which is connected with an oscillator 54. Like the one used with the embodiment of FIG. 1, the oscillator 54 is formed of an astable multivibrator, the output of which ranges from approximately 5 to 20 Hz. The output terminal of the second NAND circuit 56 is connected to the input terminal of an LED driver circuit 57. The output terminal of the driver circuit 57 is connected to one terminal of an LED 58, the other terminal of which is grounded. The driver circuit 57 conducts to let a driving current flow through the LED 58 when the input signal is at the low level. As is the case with the embodiment of FIG. 1, the LED 58 is supplied with no power and unlighted when the power switch 50 is off.

When the power switch 50 is turned on to supply the receever 41 with power, there may be provided several states of reception; an unreceiving state in period t1, tuned reception of a weak radio wave in period t2, tuned reception of a strong radio wave in period t3, and untuned reception of a strong radio wave in period t4, as shown in FIG. 5.

Figure 5A:
FIG. 5A shows an output signal waveform of the 0 V switch circuit of FIG. 4.
Figure 5B:
FIG. 5B shows an output signal waveform of a comparator used with the embodiment of FIG. 3.

In period t1, the output of the zero volt switch circuit 52 is at the low level, as shown in FIG. 5A, and the output of the comparator 53 is also at the low level, as shown in FIG. 5B. The respective low-level signals of these two circuits are applied to each input terminal of the first NAND circuit 55, thereby allowing the output signal of the NAND circuit 55 to attain the high level. This high-level signal is applied to one input terminal of the second NAND circuit 56, the other input terminal of which is supplied with the output signal of the oscillator 54 as shown in FIG. 5D. Consequently, as shown in FIG. 5E, the output signal of the second NAND circuit 56 takes an inverted waveform as compared with that of the reference frequency signal as shown in FIG.

5D. This output signal is applied to the driver circuit 57, the output of which becomes such a signal as shown in FIG. 5F, thereby turning the driver circuit on and off.

Figure 5C:
FIG. 5C shows an output signal waveform of a first NAND circuit used with the embodiment of FIG. 3.
Figure 5D:
FIG. 5D shows an output signal waveform of an oscillator used with the embodiment of FIG. 3.
Figure 5E:
FIG. 5E shows an output signal waveform of a second NAND circuit.
Figure 5F:
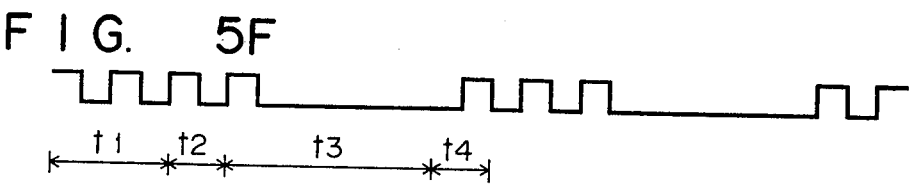
FIG. 5F shows an output signal waveform of a driver circuit used with the embodiment of FIG. 3.

When the tuning point is obtained but with a weak radio wave received in period t2, that is, when the output signals of the zero volt switch circuit 52 and the comparator circuit 53 are at the high and low levels, respectively, the same result as the case of period t1 will be produced, since the output signal of the first NAND circuit 55 will then attain the high level, as shown in FIG. 5C. That is, the LED 58 will be flickered.

When the tuning point is obtained with a strong radio wave received in period t3, the output signals of the zero volt switch circuit 52 and the comparator circuit 53 are both at the high level, as shown in FIGS. 5A and 5B. Accordingly, the output signal of the first NAND circuit 55 falls into the low level, as shown in FIG. 5C. This low level signal is applied to the second NAND circuit 56, the output of which will attain the high level, as shown in FIG. 5E. Consequently, the output of the driver circuit 57 falls into the low level, threrby rendering the LED 58 continuously on.

When a tuning error is caused although with a strong radio wave received in period t4, the output signals of the 0 V switch circuit 52 and the comparator circuit 53 are at the low and high levels, respectively. Therefore, the output signal of the first NAND circuit 55 attains the high level. Thus, the LED 58 is caused to be flickered, as is the case with periods t1 and t2.

In the aforementioned construction, the LED is not allowed to be continuously on even in case of tuned reception of a weak radio wave as well as in case of untuned reception of a strong radio wave, so that the tuning indication will be effected only when the optimum tuned state is obtained.

According to the tuning indicator circuit of this invention, the power supply and tuning indications may be achieved by means of two lighting states of a single LED flickering and continuous lihgting, so that there will be required neither the use of two separate display elements that has formerly been proposed nor the miniaturization of the display element. Moreover, there will be caused no deterioration of the indicating capability. In addition, the circuit of the invention may be of a simple construction including the comparator and oscillator, constituting no hindrance to the miniturization of the system.

Although the analog switch circuit formed of PNP transistors in used for the driver circuit in the aforementioned embodiments, the same effect may be obtained with an analog switch circuit composed of NPN transistors.

What is claimed is:

1. A tuning indicator circuit comprising a receiver, a detector circuit in said receiver for providing a detection output signal level of said receiver, a power source for supplying power to said receiver, means for detecting a tuned or untuned state of said receiver by comparing said detection output signal level of said receiver with a reference signal, means for indicating the power supply from said power source to said receiver and said tuned or untuned state, and means for controlling said indicating means so that said indicating means is rendered continuously on while said receiver is in said tuned state and so that said indicating means is turned on and off while said receiver is in said untuned state, said means for detecting the tuned or untuned state including:

a voltage divider having one end connected to said power source and the other end grounded and having an output terminal for providing said reference signal; and a comparator circuit having one input terminal connected with an output terminal of said detector circuit of said receiver and the other input terminal connected with the output terminal of said voltage divider.

2. A tuning indicator circuit comprising a receiver, an IF amplifier circuit and a level detector in said receiver for providing a detection output signal level of said receiver, a power source for supplying power to said receiver, means for detecting a tuned or untuned state of said receiver by comparing said detection output signal level of said receiver with a reference signal, means for indicating the power supply from said power source to said receiver and said tuned or untuned state, and means for controlling said indicating means so that said indicating means is rendered continuously on while said receiver is in said tuned state and so that said indicating means is turned on and off while said receiver is in said untuned state, said means for detecting the tuned or untuned state including:

a voltage divider with one end connected to said power source and the other end grounded and having an output terminal for providing said reference signal;

a comparator circuit with one input terminal connected with an output terminal of said IF amplifier circuit of said receiver via said level detector circuit and a second input terminal connected with the output terminal of said voltage divider; and a zero volt switch circuit having an input terminal connected with an output terminal of an FM detector circuit of said receiver and an output terminal connected to said means for controlling.

3. A tuning indicator circuit comprising a receiver, detector means in said receiver for providing a detection output signal level of said receiver, a power source for supplying power to said receiver, means for detecting a tuned or untuned state of said receiver comprising a voltage divider for producing a reference signal, a comparator for comparing said detection output signal level of said receiver with said reference signal, means for indicating the power supply from said power source to said receiver and said tuned or untuned state, and means for controlling said indicating means so that said indicating means is rendered continuously on while said receiver is in said tuned state and so that said indicating means is turned on and off while said receiver is in said untuned state, and said means for controlling said indicating means comprising:

an oscillator;

an AND circuit having one input terminal connected to an output terminal of said comparator and the other input terminal connected to an output terminal of said oscillator; and an analog switch circuit having an input terminal connected to an output terminal of said AND circuit and an output connected to said indicating means and adapted to supply electric power to said indicating means or interrupt it.

4. A tuning indicator circuit comprising a receiver, detector means in said receiver for providing a detection output signal level of said receiver, a power source for supplying power to said receiver, means for detecting a tuned or untuned state of said receiver comprising a voltage divider for producing a reference signal, a comparator for comparing said detection output signal level of said receiver with said reference signal, means for indicating the power supply from said power source to said receiver and said tuned or untuned state, and means for controlling said indicating means so that said indicating means is rendered continuously on while said receiver is in said tuned state and so that said indicating means is turned on and off while said receiver is in said untuned state, said means for controlling said indicating means having an oscillator, a gate circuit having inputs operatively connected to said oscillator and said comparator and having an output, a driver circuit interposed between said indicating means and said gate circuit output, and said means for indicating said tuned or untuned state being a light emitting diode having one end connected to the output terminal of said driver circuit and the other end grounded.

5. A tuning indicator circuit comprising a receiver, detector means in said receiver for providing a detection output signal level of said receiver, a power source for supplying power to said receiver, means for detecting a tuned or untuned state of said receiver comprising a voltage divider for providing a reference signal, a comparator for comparing said detection output signal level of said receiver with said reference signal, a zero volt switch connected with an output terminal of an FM detector circuit of said receiver, means for indicating the power supply from said power source to said receiver and said tuned or untuned state, and means for controlling said indicating means so that said indicating means is rendered continuously on while said receiver is in said tuned state and so that said indicating means is turned on and off while said receiver is in said untuned state, and said means for controlling said indicating means comprising:

an oscillator;

a first logic circuit having one input terminal connected to the output terminal of said zero volt switch circuit and the other input terminal connected to an output terminal of said comparator and adapted to generate a logical product of an output of said zero volt switch circuit and an output of said comparator;

a second logic circuit having one input terminal connected to an output terminal of said first logic circuit and the other input terminal connected to an output terminal of said oscillator and adapted to selectively produce an output signal from said oscillator by an output signal of said first logic circuit; and a driver circuit having an input terminal connected to an output terminal of said second logic circuit and an output connected to said indicating means and adapted to supply electric power to said indicating means or interrupt it.

* * * * *